United States Patent
Syms

(10) Patent No.: US 7,116,481 B2
(45) Date of Patent: Oct. 3, 2006

(54) OPTICAL COMPONENT

(75) Inventor: Richard Rodney Anthony Syms, London (GB)

(73) Assignee: Ericsson AB, Stockholm (SE)

( * ) Notice: Subject to any disclaimer, the term of this patent is extended or adjusted under 35 U.S.C. 154(b) by 38 days.

(21) Appl. No.: 10/470,392

(22) PCT Filed: Jan. 23, 2002

(86) PCT No.: PCT/GB02/00267

§ 371 (c)(1),
(2), (4) Date: Jan. 12, 2004

(87) PCT Pub. No.: WO02/080319

PCT Pub. Date: Oct. 10, 2002

(65) Prior Publication Data

US 2004/0151214 A1    Aug. 5, 2004

(30) Foreign Application Priority Data

Jan. 25, 2001    (GB)    .................. 0101985.0

(51) Int. Cl.
G02B 27/00    (2006.01)
H01S 3/10    (2006.01)

(52) U.S. Cl. .................. 359/578; 359/579; 359/566; 359/572; 372/20; 372/92; 372/99

(58) Field of Classification Search .................. 359/578, 359/579, 566, 558, 571, 572; 372/20, 19, 372/92, 99, 101, 102
See application file for complete search history.

(56) References Cited

U.S. PATENT DOCUMENTS

| | | | |
|---|---|---|---|
| 4,229,710 A | 10/1980 | Shoshan | |
| 4,589,115 A | 5/1986 | Burnham et al. | |
| 4,942,583 A | 7/1990 | Nazarathy et al. | |
| 5,255,273 A | 10/1993 | Nilsson et al. | |
| 5,263,037 A * | 11/1993 | Trutna, Jr. et al. | ............ 372/20 |
| 5,319,668 A | 6/1994 | Luecke | |
| 5,325,378 A | 6/1994 | Zorabedian | |
| 5,347,527 A | 9/1994 | Favre et al. | |
| 5,422,725 A | 6/1995 | Vihemsson | |
| 5,444,724 A | 8/1995 | Goto | |
| 5,501,893 A | 3/1996 | Laermer et al. | |
| 5,524,012 A | 6/1996 | Wang et al. | |
| 5,530,714 A | 6/1996 | Vihemsson et al. | |
| 5,579,327 A | 11/1996 | Ohtateme et al. | |

(Continued)

FOREIGN PATENT DOCUMENTS

EP    0 883 220 A2    12/1998

(Continued)

OTHER PUBLICATIONS

Ishii H., Tohmori Y., Yoshikuni Y., Tamamura T., Kondo Y. "Multiple-phase-shift super structure grating DBR lasers for broad wavelength tuning" IEEE Photon. Tech. Lett. 5, 613-615 (1993).

(Continued)

*Primary Examiner*—Fayez G. Assaf
(74) *Attorney, Agent, or Firm*—Kirschstein, et al.

(57) ABSTRACT

A tunable optical resonator for use as a tunable laser or optical filter comprising a cavity in which the cavity is delimited by a reflection grating and a reflector in which the reflection grating is fixed to a flexible support, the resonator also comprising means for flexing the flexible support for causing the grating to mimic rotation about a selected point. A micro-mechanical tunable resonator as above providing mode-hop free tuning.

17 Claims, 5 Drawing Sheets

U.S. PATENT DOCUMENTS

| | | | |
|---|---|---|---|
| 5,629,951 | A | 5/1997 | Chang-Hasnain et al. |
| 5,739,945 | A | 4/1998 | Tayebati |
| 5,754,571 | A | 5/1998 | Endoh et al. |
| 5,771,253 | A | 6/1998 | Chang-Hasnain et al. |
| 5,802,085 | A | 9/1998 | Lefevre et al. |
| 6,026,100 | A | 2/2000 | Maeda |
| 6,847,661 | B1 * | 1/2005 | Jerman et al. ............... 372/20 |

FOREIGN PATENT DOCUMENTS

| FR | 2 664 439 | 1/1992 |
|---|---|---|

OTHER PUBLICATIONS

Woodward S.L., Koch T.L., Koren U. "Acontrol loop which ensures high side-mode-suppression ratio in a tunable DBR laser" IEEE Photon. Tech. Lett. 4, 417-419 (1992).

Jayaraman V., Chuang Z.M., Coldren L.A. "Theory, design and performance of extended tuning range semiconductor lasers with sampled gratings" IEEE J. Quant. Elect. QE-29, 1824-1834 (1993).

Ishii H., Tanobe H., Kano F., Tohmori Y., Kondo Y., Yoshikuni Y. "Quasicontinuous wavelength tuning in super-structure-grating (SSG) DBR lasers" IEEE J. Quant. Elect. 32, 433-440 (1996).

Ishii H., Kano F., Yoshikuni Y., Yasaka H. "Mode stabilization method for superstructure-grating DBR lasers" IEEE J. Lightwave Tech. LT-16, 433-442 (1998).

Robbins D.J., Whitbread N.D., Williams P.J., Rawsthorne J.R. "Sampled grating DBR lasers for WDM systems" IEE Colloquium on *Multiwavelength Optical Networks : Devices, Systems and Network Implementations* (1998).

Morthier G., Sarlet G. "Widely tunable laser diodes and their control" Proc. 25th Eur. Conf. on Optical Communication (ECOC) Sep. 26-30, Nice, France, vol. II pp. 118-119 (1999).

Biernacki P.D. et al. "A high-speed mixed digital-to-analog circuit board for accurate control of wavelength tunable lasers for fiber-optic communications" IEEE J. Lightwave Tech. LT-17, 1222-1227 (1999).

Wyatt R., Devlin W.J. "10kHz linewidth 1.5 µm InGaAsP external cavity laser with 55 nm tuning range" Elect. Lett. 19, 110-112 (1983).

Wyatt R., Cameron K.H., Mathews M.R. "Tunable narrow line external cavity semiconductor lasers for coherent optical systems" Br. Telecom. Technol. J. 3, 5-12 (1985).

Matthews M.R., Cameron K.H., Wyatt R., Devlin W.J., "Packaged frequency-stable tunable 20KHz linewidth 1.5 µm InGaAsP external cavity laser" Elect. Lett. 21, 113-115 (1985).

Mellis J., Al-Chalabi S.A., Cameron K.H., Wyatt R., Regnault J.C., Devlin W.J., Brain M.C. "Miniature packaged external-cavity semiconductor laser with 50GHz continuous electrical tuning range" Elect. Lett. 24, 988-989 (1988).

Al Chalabi S.A., Mellis J., Hollier M., Cameron K.H., Wyatt R., Regnault J.E., Devlin W.J., Brain M.C. "Temperature and mechanical vibration characteristic of a miniature long external cavity semiconductor laser" Elect. Lett. 26, 267-269 (1990).

Bagley M., Wyatt R., Elton D.J., Wickes H.J., Spurdens P.C., Seltzer C.P., Cooper D.M., Devlin W.J. "242 nm continuous tuning from a GRIN-SC-MQW-BH InGaAsP laser in an extended cavity" Elect. Lett. 26, 267-269 (1990).

Seltzer C.P., Bagley M., Elton D.J., Perrin S., Cooper D.M. "160 nm continuous tuning of an MQW laser in an external cavity across the entire 1.3 µm communications window" Elect. Lett. 27, 95-96 (1991).

Favre F., Le Guen D., Simon J.C., Landousies B. "External cavity semiconductor laser with 15 nm continuous tuning range" Elect. Lett. 22, 795-796 (1986).

Favre F., Le Guen D. "82 nm of continuous tunability for an external cavity semiconductor laser" Elect. Lett. 27, 183-184 (1991).

Fleming M.W., Mooradian A. "Spectral characteristics of external cavity controlled semiconductor lasers" IEEE J. Quant. Elect. QE-17, 44-59 (1981).

Wittman J. et al. "Narrow-linewidth laser with prism grating/GRIN rod lens combination serving as external cavity" Elect. Lett. 23, 524-525 (1987).

Tabuchi H., Ishikawa H. "External grating tunable MQW laser with wide tuning range of 240 nm" Elect. Lett. 26, 742-743 (1990).

Notomi M., Mitomi O., Yoshikuni Y., Kano F., Tohmori Y. "Broadband tunable two section laser diode with external grating feedback" IEEE Photon. Tech. Lett. 2, 85-87 (1990).

Zorabedian P., Trutna W.R. "Alignment-stabilized grating-tuned external cavity semiconductor laser" Opt. Lett. 15, 483-485 (1990).

Zorabedian P. "Characteristics of grating-external cavity semiconductor laser containing intracavity prism beam expanders" IEEE J. Lightwave Tech. LT-10, 330-334 (1992).

Trutna W.R., Stokes L.F. "Continuously tuned external cavity semiconductor laser" IEEE J. Lightwave Tech. 11, 1279-1286 (1993).

Schweikardt H. et al. "External cavity laser temperature stabilization and control" Hewlett-Packard Journal, Feb. Issue, 20-27 (1993).

Trutna W.R., Zorabedian P. "Research on external-cavity lasers" Hewlett-Packard Journal 44, 35-38 (1993).

Zorabedian P. "Axial-mode instability in tunable external-cavity semiconductor lasers" IEEE J. Quant. Elect. QE-30, 1542-1552 (1994).

Littman M.G., Metcalf H.J. "Spectrally narrow pulsed dye laser without a beam expander" Appl. Opt. 17, 2224-2227 (1978).

Liu K.C., Littman M.G. "Novel geometry for single mode scanning of a tunable laser" Opt. Lett. 6, 117-118 (1981).

Littman M.G. "Single-mode pulsed tunable dye laser" Appl. Opt. 23, 4465-4468 (1984).

McNicholl P., Metcalf H.J. "Synchronous cavity mode and feedback wavelength scanning in dye laser oscillators with gratings" Appl. Opt. 24, 2757-2761 (1985).

Harvey K.C., Myatt C.J. "External cavity diode laser using a grazing incidence diffraction grating" Opt. Lett. 16, 910-912 (1991).

Ngyen Q.V., Dibble R.W., Day T. "High resolution oxygen absorption spectrum obtained with an external cavity continuously tunable diode laser" Opt. Lett. 24, 2134-2136 (1994).

Uenishi Y., Tanaka H., Ukita H. "AlGaAs/GaAs micromachining for monolithic integration of optical and mechanical components" Proc. SPIE 2291, 82-91 (1995).

Uenishi Y., Tsugai M., Mehregany M. "Hybrid-integrated laser diode micro-external mirror fabricated by (110) silicon micromachining" Elect. Lett. 31, 965-966 (1995).

Uenishi Y., Honma K., Nagaoka S. "Tunable laser diode using a nickel micromachined external mirror" Elect. Lett. 32, 1207-1208 (1996).

Katagiri Y., Takada A., Nishi S., Abe H., Uenishi Y., Nagaoka S. "Repetition-rate tunable micromechanical passively mode-locked semiconductor laser" Elect. Lett. 32, 2354-2355 (1996).

Vail E.C., Wu M.S., Li G.S., Eng L., Chang-Hasnain C.J. "GaAs micromachined widely-tunable Fabry-Perot filters" Elect. Lett. 31, 228-229 (1995).

Wu M.S. et al. Tunable micromachined verical cavity surface emitting laser Elect. Lett. 31, 1671-1672 (1995).

Vail E.C., Li G.S., Yuen W., Chang-Hasnain C.J. "High performance micromechanical tunable vertical cavity surface emitting lasers" Elect. Lett. 32, 1888-1889 (1996).

Li MY, Yuen W, Li GS, et al. "High performance continuously tunable top-emitting vericle cavity laser with 20nm wavelength range" Elect. Lett. 3,1051-1052 (1997).

Li M.Y., Li G.S., Chang-Hasnain C.J. "Top-emitting micromechanical VCSEL with a 31.6 nm tuning range" IEEE Photon. Tech. Lett. 10, 18-20 (1998).

Larson M.C., Pezeshki B., Harris J.S. "Vertical coupled-cavity microinterferometer on GaAs with deformable-membrane top mirror" IEEE Photon. Tech. Lett. 7, 382-384 (1995).

Larson M.C., Massengale A.R., Harris J.S. "Continuously tunable micro-electro-mechanical verical-cavity surface-emitting lasers" Int. J. Optoelectron. 10, 401-408 (1995).

Larson M.C., Harris J.S. "Wide and continuously tunable vertical cavity surface emitting lasers using a micromachined deformable-membrane mirror" Appl. Phys. Lett. 68, 891-893 (1996).

Larson M.C., Massengale A.R., Harris J.S. "Continuously tunable micromachined vertical cavity surface emitting laser with 18nm wavelength range" Elect. Lett. 32, 330-332 (1996).

Sugihwo F., Larson M.C., Harris J.S. "Low threshold continuously tunable verical-cavity surface-emitting lasers with 19.1 nm wavelength range" Appl. Phys. Lett. 70, 547-549 (1997).

Sugihwo F., Larson M.C., Harris J.S. "Simultaneous optimization of membrane reflectance and tuning voltage for tunable verticle cavity lasers" Appl. Lett. 72, 10-12 (1998).

Sugihwo F., Larson M.C., Harris J.S. "Micromachined widely tunable verical cavity laser diodes" J. Microelectromech. Syst. 7, 48-55 (1998).

Tayebati P., Wang P.D., Vakhshoori D. "Microelectromechanical tunable filters with 0.47 nm linewidth and 70 nm tuning range" Elect. Lett. 34, 76-78 (1998).

Tayebati P., Wang P.D., Vakhshoori D. "Widely tunable Fary-Perot filter using Ga(Al)As-AlO$_x$ deformable mirrors" IEEE Photon. Tech. Lett. 10, 394-396 (1998).

Tayebati P., Wang P., Azimi M., Meflah L. "Microelectromechanical tunable filter with stable half symmetric cavity" Elect. Lett. 34, 1967-1968 (1998).

Tayebati P., Wang P.D. Vakhshoori D., Lu C.-C., Azimi M., Sacks R.N. "Half-symmetric cavity tunable microelectromechanical VCSEL with single spatial mode" IEEE Photon. Tech. Lett. 10, 1679-1681 (1998).

Vakhshoori D., Tayebati P., Chih-Cheng Lu, Azimi M., Wang P., Jiang-Huai Zhou, Canoglu E. "2 mW CW singlemode operation of a tunable 1550 nm vertical cavity surface emitting laser with 50 nm tuning range" Elect. Lett. 35, 900-901 (1999).

Wang P.D., Tayebati P., Vakhshoori D., et al. "Half-symmetric cavity microelectro-mechanically tunable vertical cavity surface emitting lasers with single spatial mode operating near 950 nm" Appl. Phys. Lett. 75, 897-898 (1999).

Fan L.S., Tai Y.-C., Muller R.S. "Integrated movable micromechanical structures for sensors and actuators" IEEE Trans. Electron Devices 35, 719-723 (1988).

Mehregany M., Gabriel K.J., Trimmer W.S.N. "Integrated fabrication of polysilicon mechanisms" IEEE Trans. Electron Devices 35, 719-723 (1988).

Rogers M.S., Sniegowski J.J., Miller S.L., Barron C.C., McWhorter P.J. "Advanced micromechanisms in a multi-level polysilicon technology" Proc. SPIE 3224, 120-130 (1997).

Bhardwaj J.K., Ashraf H. "Advanced silicon etching using high density plasmas" Proc. SPIE 2639, 224-233 (1995).

Hynes A.M., Ashraf H., Bhardwaj J.K., Hopkins J., Johnston I., Shepherd J.N. "Recent advances in silicon etching for MEMS using the ASE™ process" Sensors and Actuators 74, 13-17 (1999).

Gormley C., Yallup K., Nevin W.A., Dhardwaj J., Ashraf H., Hugget P., Blackstone S. "State of the art deep silicon anisotropic etching on SOI bonded substrates for dielectric isolation and MEMS applications" 5th Int. Symp. on Semiconductor Wafer Bonding, Fall Meeting of the Electrochemical Society, Hawaii, USA Oct. 17-22 (1999).

Benitez A., Esteve J., Bausells J. "Bulk silicon microelectromechanical devices fabricated from commercial bonded and etched-back silicon-on-insulator substrates" Sensors and Actuators A50, 99-103 (1995).

Klaassen E.H., Peterson K., Noworolski J.M., Logan J., Maluf N.I., Brown J., Storment C., McCulley W., Kovacs T.A. "Silicon fusion bonding and deep reactive ion etching: a new technology for microstructures" Sensors and Actuators A52, 132-139 (1996).

Noworolski J.M., Klaassen E.H., Logan J.R., Peterson K.E., Maluf N.I. "Process for in-plane and out-of-plane single-crystal-silicon thermal microactuators" Sensors and Actuators A55, 65-69 (1996).

Juan W.H., Peng S.W. "Controlling sidewall smoothness for micromachined Si mirrors and lenses" J. Vac. Sci. Technol. B14, 4080-4084 (1996).

Juan W.H., Kao Y.H., Pang S.W. "High reflectivity micromirrors fabricated by coating high aspect ratio Si sidewalls" J. Vac. Sci. Technol. B15, 2661-2665 (1997).

Weigold J.W., Juan W.H., Pang S.W. "Etching and boron diffusion of high aspect ratio Si trenches" J. Vac. Sci. Technol. B15, 262-272 (1997).

Marxer C., Gretillat M.-A., de Rooij N.F., Battig R., Anthamatten O., Valk B., Vogel B. "Vertical mirrors fabricated by reactive ion etching for optical fiber switching applications" Proc. 10th Workshop on Micro Electro Mechanical systems, Nagoya, Japan, pp. 49-45 (1997).

Juan W.H., Peng S.W. "Batch-micromachined, high aspect ratio Si mirror arrays for optical switching applications" Proc. Int. Conf. on Solid State Sensors and Actuators (Transducers '97), paper 1A4.09P (1997).

Tang W.C., Nguyen T.-C.H., Judy M.W., Howe R.T. "Electrostatic comb drive of lateral polysilicon resonators" Sensors and Actuators A21-23, 328-331 (1990).

Hirano T., Furuhata T., Gabriel K.J., Fujita H. "Operation of sub-micron electrostatic comb-drive actuators" Proc. 6th Int. Conf. on Solid State Sensors and Actuators (San Francisco, CA, Jun. 23-27, 1991) pp. 1-4.

Jaecklin V.P., Linder C., de Rooij N.F., Moret J.M. "Micromechanical comb actuators with low driving voltage" J. Micromech. Microeng. 2, 250-255 (1992).

Maeda M. "External cavity-type of wavelength-tunable semiconductor laser light source and method for tuning wavelength thereof" US Patent 6,026,100 Feb. 15 (2000).

* cited by examiner

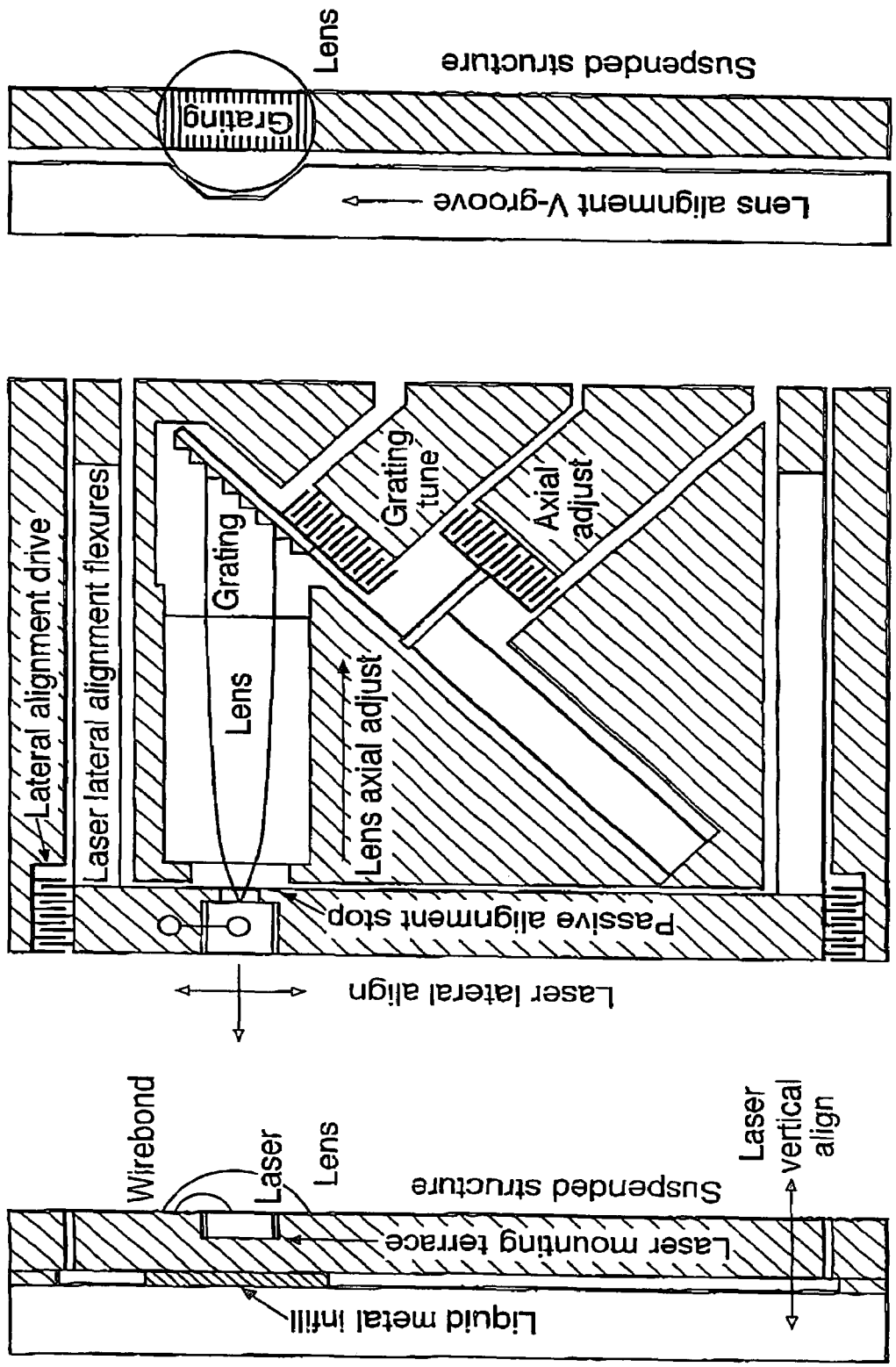

OPTICAL COMPONENT

The present invention relates to the field of optical components and, in particular to tunable optical components.

Widely tunable lasers are essential elements of dense wavelength-division modulation (DWDM) optical communications systems and wavelength-routed optical systems. Monolithic laser light sources currently exist in the form of multi-section distributed Bragg reflector (DBR) lasers. For example, Marconi Caswell Limited, Towcester, UK offers a 4-section sampled grating injection-tuned DBR laser (DC9806D) with >50 nm tuning range. However, the power output available from such monolithic tunable sources are lower than fixed wavelength devices. Furthermore, tuning of these devices requires a complex control algorithm based on stored calibration data, which may become inaccurate as the laser ages.

An alternative is offered by external cavity lasers, which may have the advantage of higher output power, a simpler relationship between control signals and the emission wavelength, reduced modal noise during tuning, and reduced sensitivity to ageing. External cavities based on thermally-tuned external fibre Bragg gratings allow excellent frequency selectivity, but a limited tuning range; mechanically-tuned dispersive gratings offer lower selectivity but a wider tuning range. External cavity laser diodes with dispersive gratings are now available.

As with conventional grating-tunable dye lasers, the most common geometries for a grating-tunable diode laser are the Littrow (see Wyatt R., Devlin W. J. "10 kHz linewidth 1.5 μm InGasP external cavity laser with 55 nm tuning range" Elect.Lett 19, 110–112 (1983) and Littman (see Littman M. G., Metcalf H. J. "Spectrally narrow pulsed dye laser without a beam expanded" Appl.Opt. 17, 2224–2227 (1978 Liu K. C., Littman M. G. "Novel geometry for single mode scanning of a tunable laser" Opt.Lett. 6, 117–118 (1981) cavity configurations.

The main problems faced by users of these cavities are to ensure 1) mode-hop free tuning, 2) thermal and mechanical stability, 3) high wavelength selectivity, and 4) wide-range tuning. Mode hopping occurs because the cavity supports a discrete set of longitudinal modes, which correspond to a discrete set of optical wavelengths. To ensure that the same mode is always selected by the grating, the cavity length must alter during tuning. Individual tuning schemes have used piezoelectric and motor translation, phase plates, and phase modulator sections in the laser to alter the apparent cavity length.

However, the same effect can be achieved using a well-chosen single motion (known as "synchronous tuning"). This involves rotating the tuning element (the grating or the mirror) about a point other than its centre, and optimum pivot points have been found for both Littrow (Favre F., Le Guen D., "Process of adjustment of a continuously tunable light source" U.S. Pat. No. 5,347,527 September (1994) and Littman (Radians "INTUN 1530 Continuous Tunable External Cavity Laser" Product Bulletin) cavities.

Most commercially-available tunable external cavity laser diodes systems are constructed from discrete components on low-expansion metal breadboards. Tuning is most commonly performed either by motor rotation or piezoelectric actuation. Although their optical performance is very good, the systems are extremely expensive, overall package dimensions are large (many cm), and tuning is too slow for use in communications. Available systems are therefore generally restricted to test functions. The smallest systems demonstrated have involved miniaturised packages containing either fixed or tunable Littrow cavities.

Miniaturization and integration are attractive, since they should reduce size and cost, and increase mechanical and temperature stability, longitudinal mode separation and the speed and precision of synchronous tuning mechanisms. Suitably engineered lasers could have a valuable sparing function in DWDM systems or act as agile sources in wavelength tuning based networks.

Micro-electromechanical systems (MEMS) refer to small electro-mechanical devices created by use of silicon (or similar) processing technology. MEMS devices may be fabricated in a wide range of materials including semiconductors (silicon, germanium, gallium arsenide, indium phosphide), diamond and metals. MEMS technology is an appropriate integration route, but its impact on tunable lasers has so far been small. Hybrid MEMS tunable external cavity lasers have been demonstrated with small nickel electroplated mirrors placed close to the AR laser facet of a diode laser, rather than blazed reflection gratings. Consequently, the external cavity has been Fabry-Perot type. The systems have shown poor tuning characteristics (Uenishi Y., Tsugai M., Mehregany M. "Hybrid-integrated laser diode microexternal mirror fabricated by (110) silicon micromachining" Elect.Lett 31, 965–966 (1995), Uenishi Y., Honma K., Nagaoka S. "Tunable laser diode using a nickel micromachined external mirror" Elect.Lett 32, 1207–1208 (1996).

The vertical cavity semiconductor laser (VCSEL) is an alternative form of laser, which emits light normal to the wafer plane (rather than from a cleaved edge facet, as in a conventional laser diode). A mechanically movable mirror may be constructed above the wafer surface using multilayer deposition and etching. This may be combined with a VCSEL to form a tunable laser, but again with an external Fabry-Perot cavity.

The main advantage of the VCSEL approach is that extremely small, monolithically integrated lasers may be constructed, with a self-aligned external cavity. Tuning speeds and stability are therefore likely to be high, and the cavity is automatically set for lasing. Testing may also be carried out on-wafer. The main disadvantages are that entirely new laser structures arc required, and output powers are likely to be lower because of the reduced active volume. Tuning characteristics may also be complicated, because of the need to engineer a tuning mechanism equivalent to the optimum pivot discussed earlier.

There is therefore a case for hybrid tunable lasers, which have gain blocks (i.e. optical amplifiers) based on existing stripe-emitting diodes, but which use MEMS technology for the tunable external cavity. Until recently, processes have not been available to fabricate the high quality components needed in a such a laser. For example, most microengineered devices have been constructed using polysilicon surface micromachining. This fabrication technique does allow the construction of a pivot bearing, but the use of thin deposited polysilicon layers results in weak components with poor mechanical properties, and the need for clearances in lithography causes slop and instability in bearings (Fan L. S., Tai Y.-C., Muller R. S. "Integrated movable micromechanical structures for sensors and actuators" IEEE Trans. Electron Devices 35, 724–730 (1988), Mehregany M., Gabriel K. J., Trimmer W. S. N. "Integrated fabrication of polysilicon mechanisms" IEEE Trans. Electron Devidcees 35, 719–723 (1988).

The present invention provides a tunable optical resonator comprising a cavity delimited in one axis at one end by a reflector and at the opposite end by a reflection grating; in which the reflection grating is fixed to a flexible support, the optical resonator also comprising means for adjusting the length of the cavity along the axis by causing the grating to mimic rotation about a selected point by flexing the support.

In a preferred embodiment, the invention provides a tunable laser light source comprising the tunable optical resonator.

In a further preferred embodiment, the invention provides a tunable optical filter comprising the tunable optical resonator.

Embodiments of the present invention will now be described by way of example, with reference to the drawings in which:

FIG. 4 shows the layout of a MEMS Littrow cavity, according to the present invention;

The tunable optical resonator of the present invention will now be described with reference to its application to tunable lasers.

Principle of the Synchronously Tuned Littrow Cavity

Figure 1:
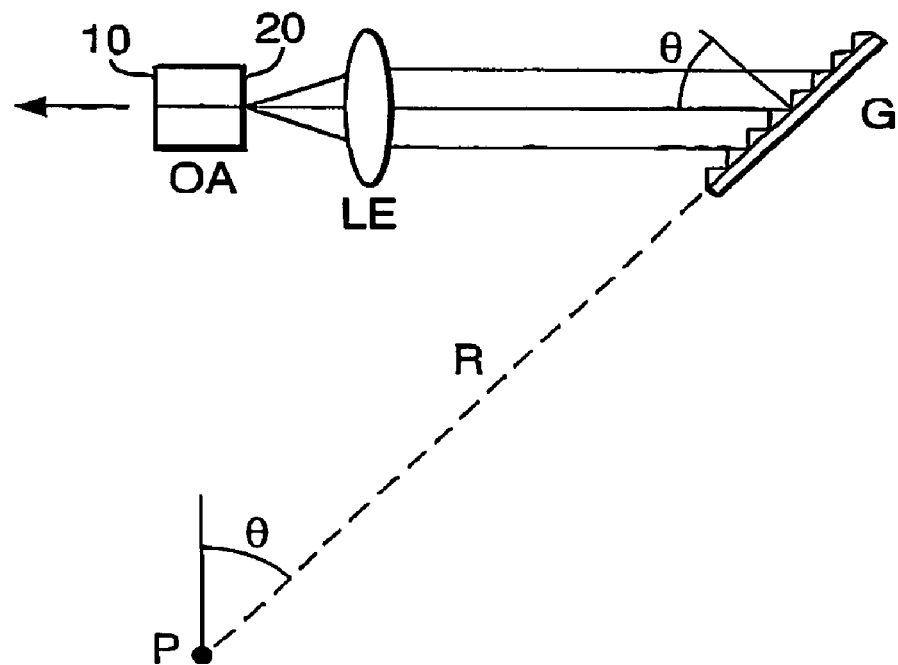
FIG. 1 shows a schematic representation of the main elements of a Littrow cavity of the prior art.

The Littrow cavity as, shown in FIG. 1, uses a single pass through the grating, which is rotated to tune the wavelength. The cavity consists of a optical amplifier (OA) with one high-reflection coated end facet (10) and one anti-reflection coated facet (20), an anti-reflection coated lens (LE) and a high reflectivity blazed reflection grating (G), although other components such as etalons, cylindrical lenses, and prisms (not shown) may also be used to improve optical performance as described later.

Figure 2:
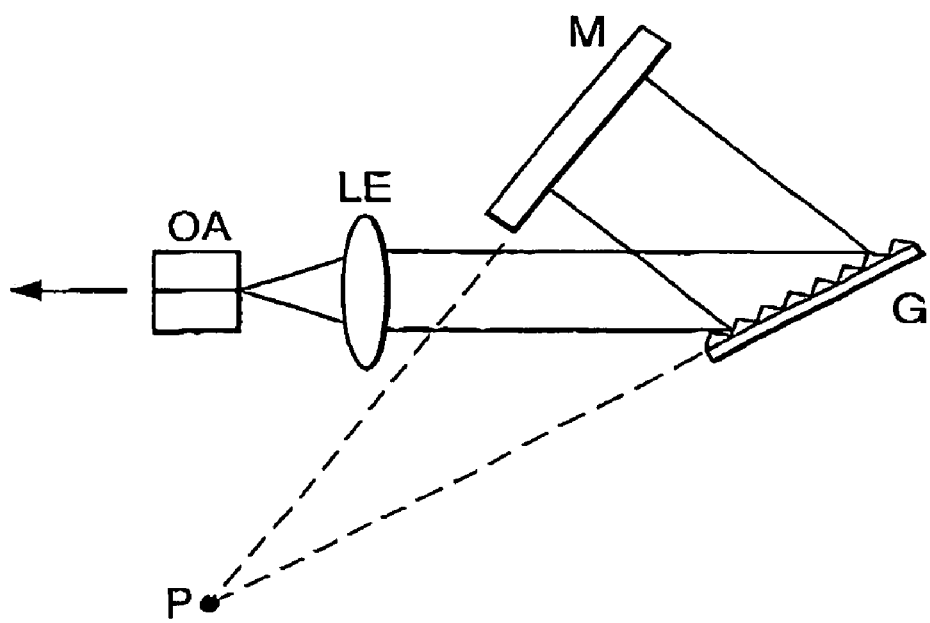
FIG. 2 shows a schematic representation of the main elements of a Littman cavity of the prior art.

The Littman cavity, as shown in FIG. 2 uses a double pass through the grating (G), and requires an external mirror (M), which is rotated for tuning. Spectral purity is enhanced in this geometry, because the filtering action of the grating is encountered twice per round trip.

In the Littrow geometry, longitudinal resonance is satisfied at wavelengths λ, for which:

$$\lambda = 2Lc/m \quad (1)$$

where Lc is the effective cavity length (i.e., the optical length of all parts of the cavity, including the laser, the lens, and the air propagation distance) and in is the mode number.

Now, nth-order retroreflection from a blazed grating of period Λ set up at an angle θ to the oncoming beam occurs at wavelengths when:

$$\lambda = \{2\Lambda/n\} \sin(\theta) \quad (2)$$

To match the resonance with the peak in grating reflectivity, the cavity length should therefore initially be adjusted so that Equations (1) and (2) are both satisfied, when:

$$Lc = \{m\Lambda/n\} \sin(\theta) \quad (3)$$

To maintain this condition when the grating is rotated by an angle dθ to tune the wavelength, the cavity length must alter by a corresponding length dLc, such that $$dLc/d\theta = \{m\Lambda/n\} \cos(\theta) = Lc/\tan(\theta) \quad (4)$$

To first order, this can be achieved by mounting the grating on a radius arm that extends tangentially from the grating as shown in FIG. 1, and by choosing the radius R of the $$R = Lc/\sin(\theta) \quad (5)$$

This construction represents the optimum mounting of the grating for synchronous tuning. Note that the result in Equation 5 is independent of both the mode number m and the grating order n, so the optimum pivot radius is unique.

The process of aligning the laser cavity so that lasing takes place is itself relatively complicated. One method involves the laser (and often some other components) being mounted on flexure suspensions, allowing gradual and precise linear and angular adjustment. After lasing has been achieved, the flexures may be fixed in position by spot-welding

Miniaturisation of Tunable Laser Diode Systems

A device according to the present invention is based on a deep etched (i.e. at least 10 microns deep) silicon microengineered breadboard which provides alignment features for the laser diode and a Graded Index (GRIN) lens, and carries an electrically-tuned blazed grating on a flexure suspension to form a Littrow cavity. Deep etching is described in Laermer F., Schilp A. "Method of anisotropically etching silicon" U.S. Pat. No. 5,501,893 Mar. 26, 1996 and Gormley C., Yallup K., Nevin W. A., Bhardwaj J., Ashraf H., Hugget P., Blackstone S. "State of the art deep silicon anisotropic etching on SOI bonded substrates for dielectric isolation and MEMS applications" 5th Int. Symp. on Semiconductor Wafer Bonding, Fall Meeting of the Electrochemnical society, Hawaii, USA Oct. 17–22 (1999). The use of deep etching and bonded silicon on insulator (BSOI) to form the structure results in high mechanical quality, while the use of a flexure mount eliminates the need for a pivot bearing.

The mounting is designed to be capable of initial passive adjustment, followed by dynamic wavelength tuning. The grating is a deep etched structure, set up normal to the wafer plane, and mounted on a novel elastic flexure suspension that mimics the action of an optimised pivot to allow wide range, mode-hop free tuning. Electrical control of grating rotation and axial mode synchronisation is by electrostatic drives, although other actuation methods may be used.

The advantage of the invention compared with a conventional grating-tuned external cavity laser diode is that miniaturisation of the tuning mechanism will allow higher tuning speeds and improve mechanical and thermal stability, and the use of a mass fabrication technology will reduce costs. The use of existing stripe emitting diodes will allow output powers to be maintained at levels similar to those of fixed wavelength devices, which are typically considerably in excess of those currently achievable from VCSELs.

Example Construction Scheme for a MEMS Tunable Laser Diode

An example MEMS tunable laser system is based on a laser diode hybridised on a silicon breadboard formed by deep reactive ion etching of bonded silicon-on-insulator (BSOI). This approach allows thick, strain-free suspended mechanical parts to be made in single crystal silicon. For example, the Advanced Silicon Etch (ASE—a trade mark of Analog Devices (Belfast)), process can etch silicon to depths >350 µm at rates of ≈3 µm per min, so that deep structures are economic. Similarly, sidewall angles of 90°±0.25° anisotropy of >0.99 and feature aspects of 40:1 are possible on this basis allowing the production of high quality parts.

Figure 3:
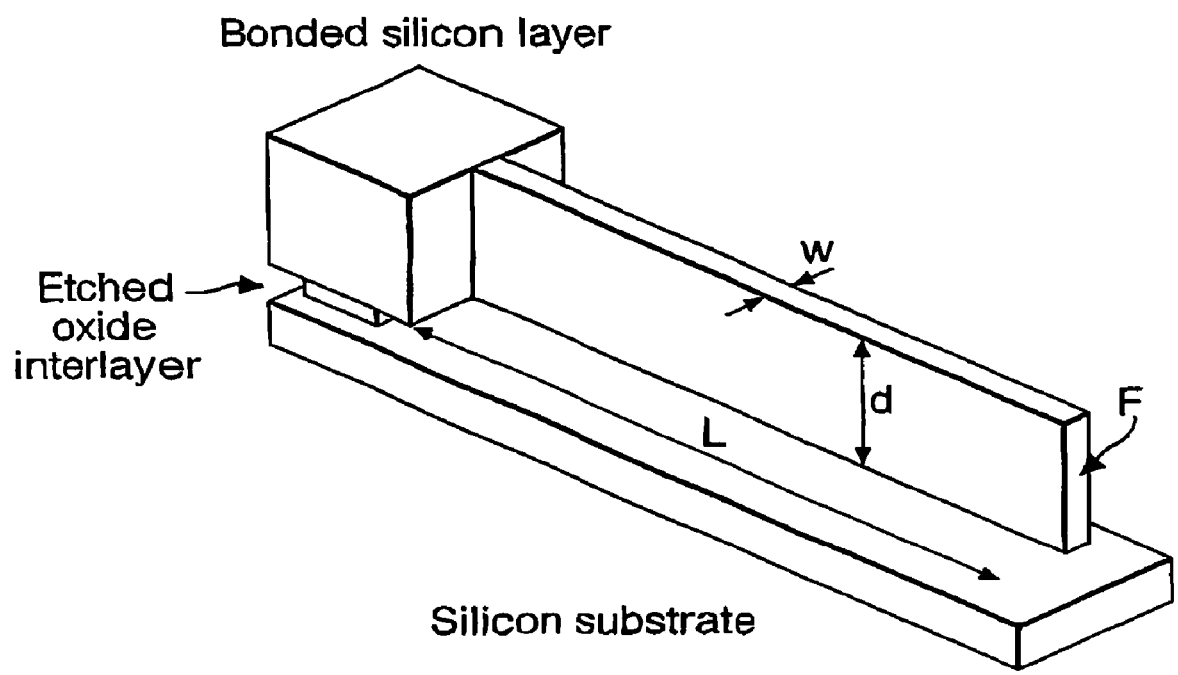
FIG. 3 shows an example MEMS suspended mechanical pat suitable for use in the present invention.

Using this approach, it is possible to fabricate suspended mechanical parts of the general form shown in FIG. 3. Here, a beam of length L and width w has been etched into the bonded layer (itself of thickness d) of a BSOI wafer by deep reactive ion etching. The oxide underlayer has been removed from beneath the relatively narrow beam by etching the sacrificial oxide interlayer with (for example) a wet acid etch such as buffered hydrofluoric acid. By choosing dimensions appropriately and timing the etch carefully. it is possible to undercut the beam completely, so that it can flex in the plane of the wafer while remaining fully supported by the relatively larger island at the left-hand end.

By combining fabrication techniques of this nature, more complex micro-opto-electromechanical systems may be fabricated. FIG. 4 shows the layout of a MEMS Littrow cavity according to a preferred embodiment. This might have dimensions ≈5 mm×6 mm: an approximate 10-fold reduction in linear dimension over conventional systems. The substrate has been anisotropically etched to form a buried alignment V-groove for a ≈1 mm diameter quarter pitch GRIN lens prior to formation of a ≈2 µm thick thermal oxide layer and attachment of a ≈400 µm thick bonded silicon layer.

The mechanical parts and grating are formed in the bonded layer. Two deep dry etched levels define the device: the first passes right through the bonded layer and outlines all precision features (grating, flexures, electrostatic drives), while the second passes only half-way through and forms a terrace to mount the laser approximately on the optical axis. All features are etched together, using two masks (resist and oxide), one of which is stripped (i.e. removed) half way through etching. The sacrificial oxide is then removed. The resultant structure is metallised to increase grating reflectivity and allow electrical connections, and solder bumps are then deposited for the laser die.

The laser and lens mounts must be capable of one-time set-up adjustment to compensate for die bonding errors and lens outside diameter (OD) and core concentricity errors. The laser is therefore mounted on a two-axis flexure, while the lens alignment groove provides the third degree of freedom. Assembly of the system involves mounting the silicon breadboard on a feedback-controlled thermoelectric cooler to ensure temperature stability of the cavity, soldering the laser die in place against coarse passive alignment stops, and wire bonding.

The cavity is aligned using external micromanipulators to slide the GRIN lens along the V-groove to achieve collimation (the least critical operation), and electrostatic actuation to flex the laser support cantilevers and correct positional errors (the most critical). Lateral adjustment is performed by electrostatic comb drives, and vertical adjustment by a parallel plate drive. The laser output is monitored using a scanning Fabry-Perot optical spectrum analyser until lasing is achieved. The lens and the laser supports are then fixed in position.

Fabrication of a first-order grating reflecting at λ≈1.5 µm with θ≈45° requires 0.75 µm features. Although the use of second-order diffraction will halve the spectral selectivity of the grating, the 1.5 µm features of a second-order grating are within the scope of direct E-beam lithography, and the resulting pattern may be transferred to the bonded silicon material using existing deep reactive ion etching techniques.

Flexure Mount for Synchronous Tuning of MEMS Tunable Diode

Figure 5A:
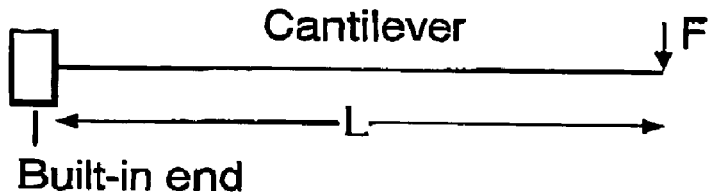
FIGS. 5 and 6 illustrate the principles of cantilever and portal frame constructions, respectively.
Figure 5B:
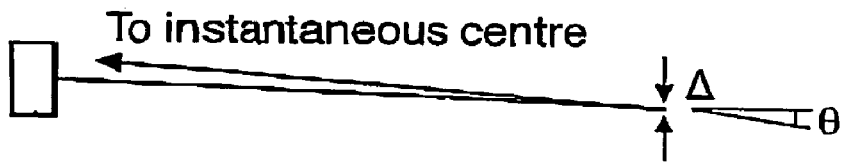

The flexure mount used for the grating has the following attributes for mode-hop free tuning: 1) a primary end displacement that mimics rotation about an optimised pivot, and 2) a secondary linear motion that allows adjustment of the cavity length without altering the grating orientation. If we consider the simple cantilever, shown in FIG. 5, the linear and angular deflections $\Delta$ and $\theta$ caused by a point load F are:

$$\Delta = F/kL \text{ and } \theta = F/kA \quad (6)$$

where kL and kA are linear and angular stiffnesses, given by:

$$kL = 3EI/L^3 \text{ and } kA = 2EI/L^2 \quad (7)$$

where E is Young's modulus and I is the second moment of area. For a rectangular beam of the type shown in FIG. 3, $I = dw^3/12$.

From Equations 6 and 7, the linear and angular deflections are related by:

$$\Delta = 2\theta L/3 \quad (8)$$

However, for an end deflection that mimics rotation about a fixed point, we require $$\Delta = \theta L \quad (9)$$

Given that Equations 8 and 9 differ, the rotation centre cannot be fixed correctly. Hence requirement 1), above, cannot be met by the simple cantilever of FIG. 5.

Figure 6A:
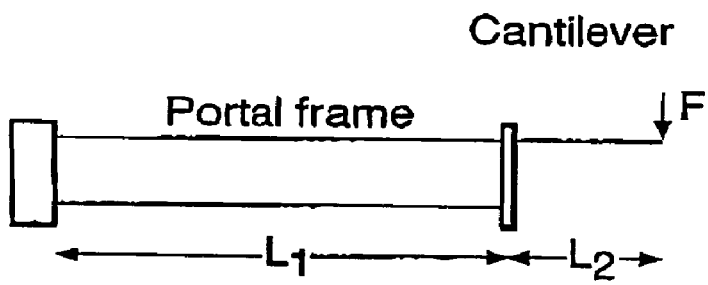
Figure 6B:
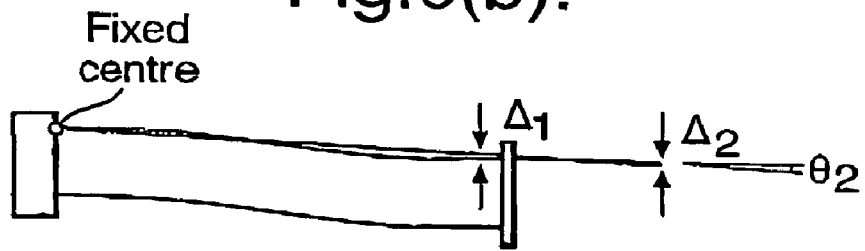

The present invention advantageously provides a compound flexure that allows linear and angular displacements to be adjusted separately, so that both conditions 1) and 2), above, can be met. FIG. 6 shows a compound flexure consisting of a cantilever of length L2 attached to a portal fame of length L1. Here, the linear and angular end displacements $\Delta$ and $\theta_2$ are:

$$\Delta = \Delta 1 + \Delta 2 = F\{1/k1L + 1/k2L\} \text{ and } \theta 2 = F\{1/k2A\}$$

where the linear stiffness k1L of the portal frame, and the linear and angular stiffnesses k2L and k2A of the cantilever are given by:

$$k1L = 24EI1/L1^3, k2L = 3EI2/L2^3 \text{ and } k2A = 2EI2/L2^2 \quad (11)$$

where I1 and I2 are the second moments of the portal and cantilever flexures, respectively.

For an end displacement that mimics rotation, we require $$\Delta = \theta 2\{L1 + L2\} \quad (12)$$

Equation 12 can be satisfied by careful choice of the ratio $\alpha = L1/L2$. In the special case when I1=I2 (i.e., for beams of equal width and depth everywhere), $\alpha$ is the solution of the cubic equation $$\alpha^3 - 12\alpha - 4 = 0 \quad (13)$$

The solution can be found numerically to be $\alpha = 3.62$.

Since this dimensional ratio is readily achievable in practise, we can deduce that a compound flexure with the dimensions L1=3.62L2 can therefore provide a tuning motion equivalent to that of an optimum pivot for the Littrow cavity geometry.

Figure 7:
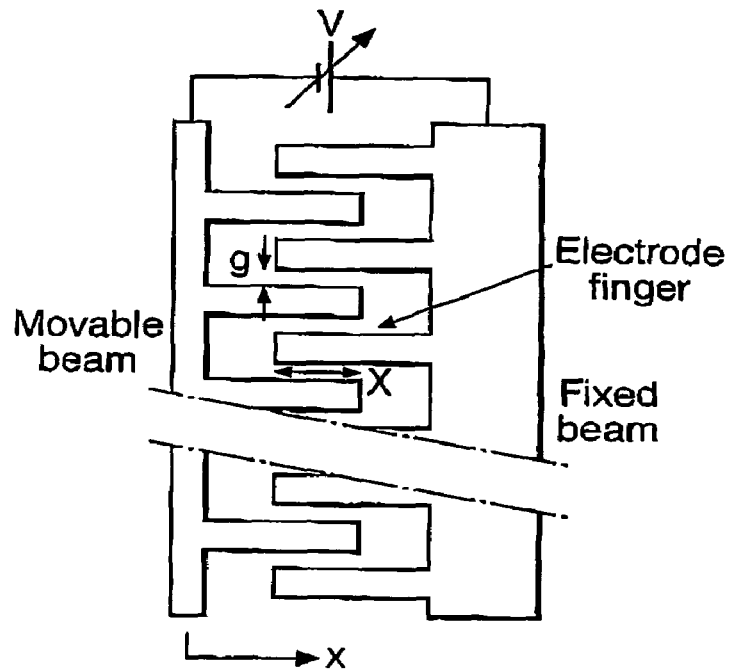
FIG. 7 shows a comb-drive electrostatic microactuator suitable for use in the present invention.

The point load F needed for tuning may conveniently be applied to the cantilever using a comb-drive electrostatic microactuator, as shown in FIG. 7. The device is essentially a variable capacitor, which consists of fixed and moving halves that carry interlocking finger electrodes. Assuming that there are N inner finger electrodes and N+1 outer electrodes, each of depth d and separated by gaps g, the overall capacitance C of the structure when the fingers overlap by a length X may be found from a parallel-plate capacitor approximation as:

$$C = \epsilon_0 2NXd/g \quad (14)$$

where $\epsilon_0$=the dielectric constant of free space.

When the capacitor is charged to a potential V, it is simple to show that there is an attractive force between the two halves of the structure that depends on the derivative of the capacitance with position, of the form:

$$F = \tfrac{1}{2} dC/dx V^2 \quad (15)$$

Since he overlap length X is linearly dependent on x, the fore may be found as:

$$F = (\epsilon_0 Nd/g) V^2 \quad (16)$$

Figure 8:
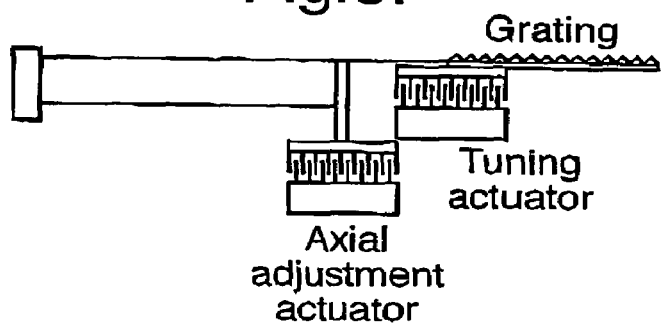
FIG. 8 shows the mounting of a comb drive electrostatic actuator on to a suspension flexure according to the present invention.

Tuning of the MEMS tunable laser may therefore be performed by mounting the moving half of a comb drive electrostatic actuator on the suspension flexure as shown in FIG. 8, so that the force given in Equation 16 may act to deflect the suspension. The deflection will be linearly related to the applied force. Because of the squared term in Equation 16, the deflection will not vary linearly with the applied voltage, however, alternative electrode geometries exist that have a linear force-voltage relationship.

Most importantly, applying a further point load to the portal frame using a second comb drive electrostatic actuator as shown in FIG. 8 allows independent adjustment of the linear position of the grating, without affecting its angular orientation. This second tuning element therefore allows the cavity to be tuned axially, to compensate for initial set-up errors made in aligning a cavity axial mode with the peak in grating reflectivity.

Example Design Parameters

We may estimate some typical example design parameters as follows, assuming that the elastic suspension is fabricated with constant beam widths of 10 μm in a bonded silicon-on-insulator wafer carrying a 100 μm thick bonded layer.

In this case, the beam width and depth are w=10 μm, d=100 μm, the second moment of area is $I = (100 \times 10^3) \times 10^{-24}/12 = 8.333 \times 10^{-21}$ m$^{-4}$ and Young's modulus for silicon is $E=1.08 \times 10^{11}$ N/m$^2$.

We shall assume the following arbitrary (but typical) lengths for the suspension members, namely L1=3.62 mm, and L2=1 mm. In this case, the effective radius R of the grating pivot arm is R=L1+L2=4.62 mm, and the cavity length is Lc=3.27 mm.

Using these parameters, the linear stiffness parameters k1L and k2L may be obtained from Equation 11 as:

$$K1L = 24 \times 1.08 \times 10^{11} \times 8.333 \times 10^{-21}/(3.62 \times 10^{-3})^3 = 0.45 \text{ N/m},$$

$$k2L = 3 \times 1.08 \times 10^{11} \times 8.333 \times 10^{-21}/(1 \times 10^{-3})^3 = 2.7 \text{ N/m} \quad (17)$$

The overall linear stiffness kL of the compound suspension system may then be found using the conventional relation for series-connected elastic springs, namely:

$$1/kL = 1/k1L + 1/k2L = 2.6 \text{ m/N so that } kL = 0.385 \text{ N/m} \quad (18)$$

Tuning involves very small rotation of the grating. Differentiating Equation 2, we obtain:

$$d\theta = \tan(\theta) d\lambda/\lambda \quad (19)$$

For a laser operating at λ=1.5 μm wavelength, with the grating angle set to θ≈45°, a tuning range of Δλ=±25 nm requires rotation of the grating through an angular range of Δλ max=±0.95°.

Rotation through this small angle requires a linear tangential motion of the grating of:

$$\Delta \text{ max} = \pm R\Delta\theta \text{ max} = 4.62 \times 10^{-3} \times 0.95 \times \pi/180 \approx 80 \times 10^{-6}$$
$$m, \text{ or } 80 \text{ μm} \quad (20)$$

To achieve this motion through electrostatic actuation, the force required is:

$$F = kL\Delta \text{ max} = 80 \times 10^{-6}/2.6 \approx 30 \times 10^{-6} \text{ N, or } 30 \text{ μN} \quad (21)$$

The maximum drive voltage may then be found by comparing Equations 16 and 21 to get:

$$(\epsilon_0 Nd/g) V\text{max}^2 = F = kL\Delta \text{ max} \quad (22)$$

so that the maximum voltage is:

$$V\text{max} = \sqrt{\{kL\Delta \text{ max } g/\epsilon_0 Nd\}} \quad (23)$$

If the electrostatic actuator is considered to consist of (say) an array of fingers with widths of 6 μm, separated by gaps of g=4 μm, then N=50 finger pairs may be contained in an actuator of overall length of (say) 1 mm. The maximum voltage is then:

$$V\text{max} = \sqrt{\{30 \times 10^{-6} \times 4 \times 10^{-6}/8.85 \times 10^{-12} \times 50 \times 100 \times 10^{-6}\}} \approx 50V \quad (24)$$

There is scope in this design to alter the drive voltage by means of (i) reducing the electrode gaps, or (ii) by increasing the number of electrodes, or (iii) by decreasing the suspension stiffness We may estimate the mass of the grating and the tuning actuator as follows. The calculations above suggest a comb electrode with a 1 mm span. A beam supporting the grating and moving electrode fingers over this span might have typical dimensions of 1 mm×50 μm. If the maximum translation of the grating is around 80 μm, the comb fingers must be approximately 100 μm long. Assuming that there are 50 electrodes, each 6 μm wide (as above), and assuming a structural depth of 100 μm and a density of 2330 kg/m$^3$ for silicon, the approximate total moving mass is therefore:

$$m = \{(10^{-3} \times 50 \times 10^{-6}) + (50 \times 100 \times 10^{-6} \times 6 \times 10^{-6})\} \times 10^{-4} \times 2330 = 1.864 \times 10^{-8} \text{ kg} \quad (25)$$

For a mass-spring resonance, the resonant frequency ω is given by:

$$\omega = \sqrt{(kL/m)} = \sqrt{(0.385/1.864 \times 10^{-8})} = 4544 \text{ rad/s, or } 725 \text{ Hz} \quad (26)$$

Tuning times are therefore likely to be in excess of 2 ms. This implies that tuning rates will be considerably in excess of conventional external cavity lasers.

Figure 9:
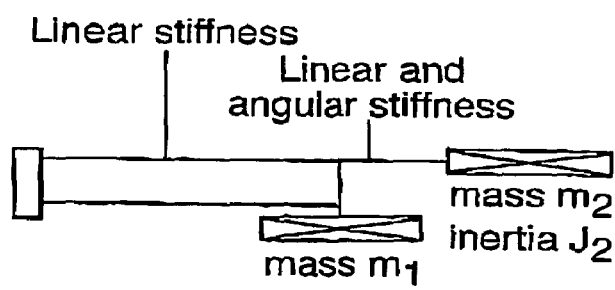
FIG. 9 shows a dynamical model of a MEMS tunable laser system according to the present invention.

FIG. 9 shows that the mount actually has three degrees of freedom, since it effectively contains one mass m1 mounted on a linear spring (the axial tong actuator), coupled to another mass m2 (the grating and its actuator), which also has inertia J2 and is mounted on a spring with linear and angular stiffness. Consequently, three characteristic modes are to be expected. However, appropriate dynamic behaviour can be obtained up to the frequency of the lowest order mode.

The selective nature of the tunable resonator of the present invention also has application in tunable optical filters advantageously offering mode hop free tuning.

The invention claimed is:

1. A tunable optical resonator, comprising: a cavity delimited, at one end, by a reflector and, at an opposite end, by a reflection grating, the reflection grating being supported by a flexible support thereby to allow adjustment of a length of the cavity, the flexible support including a portal frame arranged to flex thereby to allow linear displacement of the reflection grating, and a cantilever arranged to flex thereby to allow angular displacement of the reflection grating, the flexible support being arranged such that the flexing of the portal frame and the cantilever mimics rotation about a selected point.

2. The tunable optical resonator as claimed in claim 1, wherein the cantilever is arranged, when flexed, also to allow linear displacement of the reflection grating.

3. The tunable optical resonator as claimed in claim 1, comprising at least one actuator arranged to flex the flexible support to provide rotation and translation of the reflection grating in a single motion.

4. The tunable optical resonator as claimed in claim 1, wherein the flexible support is implemented in a semiconductor material.

5. The tunable optical resonator as claimed in claim 4, wherein the flexible support is produced by deep etching the semiconductor material.

6. The tunable optical resonator as claimed in claim 1, wherein the reflection grating comprises a blazed grating.

7. The tunable optical resonator as claimed in claim 1, wherein the portal frame has a fixed end and a free end, and wherein the cantilever is supported by the free end.

8. The tunable optical resonator as claimed claim 1, wherein the movement of the reflection grating is arranged to provide mode hop free tuning.

9. The tunable optical resonator as claimed in claim 1, wherein the cavity defines an axis and a radial direction, and comprising first adjusting means for radial adjustment of a position of the reflection grating and second adjusting means for independent axial adjustment of the position of the reflection grating.

10. A tunable laser light source, comprising: a tunable optical resonator including a cavity delimited, at one end, by a reflector and, at an opposite end, by a reflection grating, the reflection grating being supported by a flexible support thereby to allow adjustment of a length of the cavity, the flexible support including a portal frame arranged to flex thereby to allow linear displacement of the reflection grating, and a cantilever arranged to flex thereby to allow angular displacement of the reflection grating, the flexible support being arranged such that the flexing of the portal frame and the cantilever mimics rotation about a selected point.

11. The tunable laser light source as claimed in claim 10, in which the reflector is comprised in an optical amplifier.

12. The tunable laser light source as claimed in claim 10, and comprising a stripe-emitting diode.

13. A tunable optical filter, comprising: a tunable optical resonator, the resonator including a cavity delimited, at one end, by a reflector and, at an opposite end, by a reflection grating, the reflection grating being supported by a flexible support thereby to allow adjustment of a length of the cavity, the flexible support including a portal frame arranged to flex thereby to allow linear displacement of the reflection grating, and a cantilever arranged to flex thereby to allow angular displacement of the reflection grating, the flexible support being arranged such that the flexing of the portal frame and the cantilever mimics rotation about a selected point.

14. An optical communications system, comprising: a tunable optical resonator including a cavity delimited, at one end, by a reflector and, at an opposite end, by a reflection grating, the reflection grating being supported by a flexible support thereby to allow adjustment of a length of the cavity, the flexible support including a portal frame arranged to flex thereby to allow linear displacement of the reflection grating, and a cantilever arranged to flex thereby to allow angular displacement of the reflection grating, the flexible support being arranged such that the flexing of the portal frame and the cantilever mimics rotation about a selected point.

15. A tunable optical resonator, comprising: a cavity delimited in one axis, at one end, by a reflector and, at an opposite end, by a reflection grating, the reflection grating being fixed to a flexible support, means for adjusting a length of the cavity along the one axis by causing the reflection grating to mimic rotation about a selected point by flexing the flexible support, the flexible support being implemented in a semiconductor material, the means for adjusting including first adjusting means for radial adjustment of a position of the reflection grating and second adjusting means for independent axial adjustment of the position of the reflection grating.

16. The tunable optical resonator according to claim 15, wherein the flexible support includes a portal frame arranged to flex thereby to allow linear displacement of the reflection grating, and a cantilever arranged to flex thereby to allow angular displacement of the reflection grating.

17. The tunable optical resonator according to claim 16, wherein the portal frame has a fixed end and a free end, and wherein the cantilever is supported by the free end.

* * * * *

UNITED STATES PATENT AND TRADEMARK OFFICE
CERTIFICATE OF CORRECTION

PATENT NO. : 7,116,481 B2
APPLICATION NO. : 10/470392
DATED : October 3, 2006
INVENTOR(S) : Syms It is certified that error appears in the above-identified patent and that said Letters Patent is hereby corrected as shown below:

On the Face Page, in Field (57), under "ABSTRACT", in Column 2, Lines 4-5, delete "support, the resonator also comprising means for flexing the flexible support" and insert -- support. The support is flexed --, therefor.

On the Face Page, in Field (57), under "ABSTRACT", in Column 2, Line 7, delete "as above providing" and insert -- provides --, therefor.

On Page 2, in Field (56), under "OTHER PUBLICATIONS", in Column 1, Line 40, delete "267-269" and insert -- 1159-1160 --, therefor.

In Column 1, Line 31, delete "InGasP" and insert -- InGaAsP --, therefor.

In Column 1, Line 34, delete "expanded"" and insert -- expander" --, therefor.

In Column 3, Line 19, delete "pat" and insert -- part --, therefor.

In Column 3, Line 59, delete "in" and insert -- m --, therefor.

In Column 6, Line 41, delete "fame" and insert -- frame --, therefor.

In Column 6, Line 42, delete "$\theta_2$" and insert -- $\theta2$ --, therefor.

In Column 7, Line 21, delete "fore" and insert -- force --, therefor.

UNITED STATES PATENT AND TRADEMARK OFFICE
CERTIFICATE OF CORRECTION

PATENT NO. : 7,116,481 B2
APPLICATION NO. : 10/470392
DATED : October 3, 2006
INVENTOR(S) : Syms It is certified that error appears in the above-identified patent and that said Letters Patent is hereby corrected as shown below:

In Column 7, Lines 49-50, delete "$I=(100\times10^3)\times10^-{}_{24}/12=8.333\times10^{-21}$" and insert -- $I=(100\times10^3)\times10^{-24}/12=8.333\times10^{-21}$ --, therefor.

In Column 8, Line 61, delete "tong" and insert -- tuning --, therefor.

Signed and Sealed this

Tenth Day of March, 2009

JOHN DOLL
*Acting Director of the United States Patent and Trademark Office*